Oct. 21, 1958
J. W. LACY
2,856,681
METHOD OF FIXING LEADS TO SILICON AND ARTICLE RESULTING THEREFROM
Filed Aug. 8, 1955
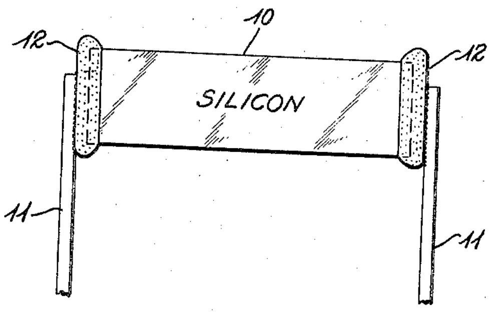
INVENTOR
James W. Lacy
BY Stevens, Davis, Miller and Mosher
ATTORNEYS United States Patent Office 2,856,681

Patented Oct. 21, 1958

2,856,681

METHOD OF FIXING LEADS TO SILICON AND ARTICLE RESULTING THEREFROM

James W. Lacy, Dallas, Tex., assignor to Texas Instruments Incorporated, Dallas, Tex., a corporation of Delaware Application August 8, 1955, Serial No. 527,039

3 Claims. (Cl. 29—472.9)

The present invention relates to a method for fastening wires or tabs to a silicon block and more particularly relates to a method for fastening lead wires or tabs to a silicon diode or transistor and also to the article produced by the practice of this method.

One of the major problems in the semiconductor field is the attaching of lead wires or tabs to silicon blocks. An accepted procedure in this respect is to first plate or coat with rhodium, nickel or other similar metal the portions of the silicon block to which the lead wires or tabs are to be attached and thereafter to simply solder or otherwise fix the lead wires or tabs to the plated portion. For this purpose, it has heretofore been proposed to nickel plate the portions of a silicon block and to thereafter attach a lead wire or a tab, to the silicon block by soldering it directly to the nickel plated region. Although any suitable material may be used for the lead wire or tab, it is usually of copper, steel, tungsten, or one of the various nickel-iron alloys sold under trade names such as "Kovar," "Dumet" and others. This particular technique has met with some success, however, on an over-all basis, it is lacking in many respects.

It is already recognized that it is practically impossible to directly attach a lead wire, such as for example a nickel-iron alloy wire, to a silicon block. The two materials do not alloy at all and consequently they will part or crack apart upon being subjected to an increase or decrease in temperature on account of their differences in thermal coefficients in expansion. By adopting the technique of nickel plating the regions of the silicon bar which contact is being made, the problem has in part been solved. Nickel can be made to adhere to the silicon and will remain in contact without parting or cracking over a limited temperature range. If. however, the temperature should become excessive in either direction, the differences in thermal coefficients in expansion between the nickel and the silicon will cause the two elements to crack or part thereby breaking the connection between the two.

It is an object of the present invention to provide a unique method for conditioning a silicon block so that lead wires or tabs can be soldered to the silicon block and the wires or tabs will not crack or part when subjected to a wide range of temperatures as are encountered in operation. In essence, then the present invention seeks to provide a method for attaching lead wires and tabs to silicon blocks which will not fail over a wide temperature range.

This is accomplished by means of the present invention by employing a unique composition for coating those portions of the silicon block to which connection is desired to be made. The particular composition which has been found to give excellent results in this connection is basically a form of silver paste which can be applied to selected portions of the silicon bar or block and thereafter treated in a manner to cause the coating to adhere very well with the silicon. Thereafter, the lead wires or tabs can be soldered to the coated portions of the silicon block and the over-all construction will operate very satisfactorily within a wide temperature range without the danger of the coating cracking or parting from the silicon.

This particular arrangement according to the present invention provides a means of obtaining good mechanical contact with the silicon bar or block while at the same time permitting good electrical contact. Both of these factors must be harmonized in order to insure a good product. This invention harmonizes these two factors and thus a product is produced which will operate reliably over a wide temperature range.

It is an object of the present invention to provide a method for attaching lead wires and tabs to silicon blocks in a fashion that the connection will not fail over a wide temperature range.

It is a further object of the present invention to provide a method for attaching lead wires and tabs to a silicon block which will successfully overcome the problems previously encountered in this particular connection.

It is a still further object of the present invention to provide a novel method of connecting lead wires and tabs to silicon blocks characterized by simplicity in the techniques necessarily involved in the carrying out of this method.

It is a still further object of the present invention to provide a method as above described which can be conducted in an efficient, economical and expedient manner.

It is a further object of the present invention to provide an improved product which will not be subject to the disadvantage of the connection between the lead wire or tab and silicon block cracking or parting when subjected to variations in the operating temperatures of the unit.

Various other and further object of the present invention will become more fully apparent from the following detailed description when taken in conjunction with the drawing in which the sole figure illustrates a silicon block prepared according to the method of the present invention and having attached at either end thereof a lead wire.

Referring now to the sole figure, it will be noted that a silicon block 10 is shown having connected at either end thereof a lead wire 11 which, for purposes of illustration, may be considered as a nickel-iron alloy wire. Although 11 is illustrated as a wire, it will be appreciated that the lead connection may be in any other suitable form according to the circumstances required. Thus, for example, the lead connection may be in the form of a ribbon or a tab and is not necessarily limited to a wire. In short, a wire is shown for purposes of illustration only.

The region of the silicon block 10 to which the nickel-iron alloy wire 11 is to be connected is first coated with a silver paste as indicated by the numeral 12 with the coating covering, as illustrated in the figure, not only the end surface of the silicon block 10 but also extending partly around the silicon block 10 whereby it in effect cups the end of the block. The paste is put on in a layer of not less than 0.003 of an inch thick and preferably about 0.005 to 0.006 of an inch thick. The particular silver paste which is preferred is a silver paste composition which includes the basic ingredient of silver, bismuth and an oil. The arrangement of these ingredients and their functions are generally along the following lines. The silver acts as a base for the composition and the bismuth acts as a flux or catalyst. The oil is present merely as a binder medium.

The proportions of the various ingredients of the composition may vary within limits. The flux or catalyst is present in an amount of about 1% or less by weight of the composition. The silver particles are present in an amount of from about 40% to about 85% by weight and the binder is present in an amount of from about 15% to about 60% by weight. These are the broad ranges for the ingredients. It is preferred, however, that a paste be compounded containing from about 65% to about 70% by weight of silver particles, from about 40% to about 35% by weight of a binder which may be an oil such as turpentine, linseed oil, or a combination of such compounds and about 1% or less of a flux or catalyst such as bismuth.

Whereas a preferred silver paste composition is mentioned above, it will be appreciated that other silver base compositions may be utilized. It is important, however, that the composition selected contains silver in appreciable quantities with the composition preferably being constituted as a paste. Such is preferred because of the ease of handling the composition, as well as the ease of applying the composition to the silicon bar, block or wafer.

After the end of the block 10 has been coated, as indicated by 12, the block is placed into an oven and baked at a temperature of preferably around 625° C. The baking is continued for a period of approximately 20 minutes. An important aspect in conjunction with the baking of the silicon block concerns the permanent change in resistivity of the silicon in relation to the temperature the silicon is subjected to. The normal curve for the percentage rate of change in resistivity of silicon plotted against temperature reveals that at the lower temperatures there is little increase in the rate of change with temperature until about 150° C. to 200° C. From that point the rate of change in resistivity rises rapidly as the temperature increases until it reaches a peak near 470° C. Thereafter, the rate of change in resistivity falls sharply as the temperature increases until the temperature reaches approximately 525° C. where the curve levels off at a fairly low rate of change. Above 525° C. the rate of change of resistivity remains substantially constant at this low value. It is thus evident that the preferred baking temperature of 625° C. is well above 525° C. and accordingly, the change in resistivity at this temperature will be small. Actually, the best range for baking the silicon with the silver paste coating thereon is between 525° C. and 700° C. In this region, the baking time required is approximately from 16 minutes to about 45 minutes to an hour. In connection with the baking period, it will be appreciated that the lower the temperature the longer the period required. Thus, it is possible, although not recommended, to bake the bar at a temperature of 200° C. in which case it will take approximately 36 hours to complete this step of the process. Likewise, it is also possible to bake the block at a temperature of from 800 to 900° C. in which case it will take approximately 10 minutes. At some intermediate temperature, said 420° C., the baking period will be 2 to 3 hours. Whereas it is possible to bake the silicon block at a temperature of from 200 to 900° C. it is preferred that it be baked at a temperature in the range of 525° C. to 700° C. and preferably at a temperature of about 625° C.

The silver paste actually will not fuse with the silicon block, but rather will simply stick to it. The precise physical phenomenon associated with this method is not fully known and therefore it becomes difficult to state precisely what makes the process work so successfully. Notwithstanding the inability to provide a clear theoretical explanation of the process, it has been found and proved beyond question that the method described herein produces a superior product from the standpoint of providing a means whereby lead wires or tabs can be securely fastened to a silicon block.

The actual connection of the lead wires or tabs to the now prepared silicon block can readily be accomplished by soldering the lead wires or tabs, in the case of the illustration nickel-iron alloy wire 11, onto the coated region of the block 10. The solder employed for this purpose should contain from 2% to 5% silver with the remainder being tin. An example of a solder which may be used in this connection is a solder composed of approximately 95% tin and 5% silver. The presence of the silver in the solder composition is highly desirable in view of the silver paste used in the coating since the solder will have a great affinity for the silver paste. Any convenient flux may be employed in the soldering operation, as will be apparent to any one skilled in soldering art.

Although the present invention has been discussed with reference to a preferred method and to a single embodiment, nevertheless various changes and modifications such as would be obvious to one skilled in the art which do not in fact depart from the spirit, scope and contemplation of the invention are within the purview of the inventive concept presented herein.

What is claimed is:

1. A method of making contact to a silicon element which comprises the steps of coating a portion of a silicon element with a paste consisting of silver particles, a vaporizable binder and bismuth as a catalyst, said silver particles constituting at least 40% by weight of the composition and said catalyst constituting about 1% by weight of the composition, baking the coated silicon element at a temperature of from about 525° C. to about 700° C. for a period of from about 15 minutes to about 60 minutes, and attaching a lead to said coating.

2. A method of making contact to a silicon element which comprises the steps of coating a portion of a silicon element with a paste consisting of silver particles, a vaporizable binder and bismuth as a catalyst, said silver particles constituting from about 65% to about 70% by weight of the composition and said catalyst constituting about 1% by weight of the composition, baking the coated silicon element at a temperature of from about 525° C. to about 700° C. for a period of from about 15 minutes to about 60 minutes, and attaching a lead to said coating.

3. A method of making contact to a silicon element which comprises the steps of coating a portion of a silicon element with a paste consisting of silver particles, a vaporizable binder and bismuth as a catalyst, said silver particles constituting from about 65% to about 70% by weight of the composition and said catalyst constituting about 1% by weight of the composition, baking the coated silicon element at a temperature of about 625° C. for a period of about 20 minutes, and attaching a lead to said coating.

References Cited in the file of this patent

UNITED STATES PATENTS

| | | |
|---|---|---|
| 2,220,961 | Kern | Nov. 12, 1940 |
| 2,395,442 | Ballard | Feb. 26, 1946 |
| 2,406,401 | Richardson | Aug. 27, 1946 |
| 2,509,909 | Davis | May 30, 1950 |
| 2,623,102 | Shockley | Dec. 23, 1952 |
| 2,629,672 | Sparks | Feb. 24, 1953 |